(12) United States Patent
Lo et al.

(10) Patent No.: US 11,329,202 B2
(45) Date of Patent: May 10, 2022

(54) MICRO COMPONENT STRUCTURE AND MICRO COMPONENT DISPLAY DEVICE

(71) Applicant: PlayNitride Display Co., Ltd., MiaoLi County (TW)

(72) Inventors: Yu-Yun Lo, MiaoLi County (TW); Bo-Wei Wu, MiaoLi County (TW); Sheng-Chieh Liang, MiaoLi County (TW); Shiang-Ning Yang, MiaoLi County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 0 days.

(21) Appl. No.: 16/819,195

(22) Filed: Mar. 16, 2020

(65) Prior Publication Data
US 2021/0167261 A1 Jun. 3, 2021

(30) Foreign Application Priority Data
Dec. 3, 2019 (TW) ................. 108144006

(51) Int. Cl.
*H01L 33/58* (2010.01)
*H01L 25/075* (2006.01)
*H01L 33/24* (2010.01)

(52) U.S. Cl.
CPC .......... *H01L 33/58* (2013.01); *H01L 25/0753* (2013.01); *H01L 33/24* (2013.01)

(58) Field of Classification Search
CPC ..... H01L 33/58; H01L 25/0753; H01L 33/24; H01L 33/54; H01L 33/56; H01L 33/0004–648
See application file for complete search history.

(56) References Cited

U.S. PATENT DOCUMENTS

| 2011/0095311 A1* | 4/2011 | Marchi | ............... H01L 25/0753 257/88 |
| 2014/0367711 A1 | 12/2014 | Bibi et al. | |
| 2020/0274039 A1* | 8/2020 | Chen | ................... H01L 25/0753 |

FOREIGN PATENT DOCUMENTS

| CN | 107424524 | 12/2017 |
| CN | 109935575 | 6/2019 |
| CN | 109935668 | 6/2019 |
| CN | 110277053 | 9/2019 |
| TW | 201909408 | 3/2019 |

(Continued)

OTHER PUBLICATIONS

"Office Action of Taiwan Counterpart Application", dated Jun. 9, 2020, p. 1-p. 7.

(Continued)

*Primary Examiner* — Cuong B Nguyen
(74) *Attorney, Agent, or Firm* — JCIPRNET

(57) ABSTRACT

A micro component structure includes a substrate, a micro component and a fixing structure. The micro component and the fixing structure are disposed on the substrate. The micro component has a spacing from the substrate. The fixing structure includes a first supporting layer and a second supporting layer. The micro component is connected to the substrate through the fixing structure. The first supporting layer is connected to the micro component and located between the second supporting layer and the micro component. A refractive index of the first supporting layer is greater than a refractive index of the second supporting layer.

17 Claims, 11 Drawing Sheets

(56) References Cited

FOREIGN PATENT DOCUMENTS

| TW | 201917910 | 5/2019 |
| TW | 201929188 | 7/2019 |

OTHER PUBLICATIONS

"Office Action of China Counterpart Application", dated Jun. 12, 2020, p. 1-p. 8.

* cited by examiner

MICRO COMPONENT STRUCTURE AND MICRO COMPONENT DISPLAY DEVICE

CROSS-REFERENCE TO RELATED APPLICATION

This application claims the priority benefit of Taiwan application serial no. 108144006, filed on Dec. 3, 2019. The entirety of the above-mentioned patent application is hereby incorporated by reference herein and made a part of this specification.

BACKGROUND OF THE INVENTION

Field of the Invention

The disclosure relates to a semiconductor structure, and in particular relates to a micro component structure.

Description of Related Art

At present, the transfer of a micro light emitting diode is mainly performed through electrostatic force or magnetic force to transfer the micro light emitting diode on a carrier substrate onto a receiving substrate. In general, the micro light emitting diode is held by a fixing structure to enable the micro light emitting diode to be easily taken from the carrier substrate and transported and transferred onto the receiving substrate, and the fixing structure is configured to fix the micro light emitting diode to prevent the quality of the micro light emitting diode from being affected by other external factors during transfer. Because the fixing structure is made of a photosensitive material or a single-layer dielectric film at present, the width of the fixing structure is limited due to the reduction in the size of the micro light emitting diode, and the structural strength of the fixing structure is weak. Therefore, how to enable the fixing structure to temporarily hold the micro light emitting diode and more easily and efficiently transport and transfer the micro light emitting diode between the carrier substrate and the receiving substrate has become one of the issues that attract attention in the industry at present.

SUMMARY OF THE INVENTION

The invention is directed to a micro component structure, and a fixing structure of the micro component structure has a good structural strength.

A micro component structure of the invention includes a substrate, a micro component and a fixing structure. The micro component and the fixing structure are disposed on the substrate. The micro component has a spacing from the substrate. The fixing structure includes a first supporting layer and a second supporting layer. The micro component is connected to the substrate through the fixing structure. The first supporting layer is connected to the micro component and located between the second supporting layer and the micro component. A refractive index of the first supporting layer is greater than a refractive index of the second supporting layer.

In an embodiment of the invention, a first orthogonal projection area of the first supporting layer on the micro component is greater than or equal to a second orthogonal projection area of the second supporting layer on the micro component.

In an embodiment of the invention, a ratio of the second orthogonal projection area to the first orthogonal projection area is greater than or equal to 0.8 and less than or equal to 1.

In an embodiment of the invention, an orthogonal projection shape of the first supporting layer on the micro component and an orthogonal projection shape of the second supporting layer on the micro component are disposed conformally.

In an embodiment of the invention, a thickness of the second supporting layer is greater than a thickness of the first supporting layer.

In an embodiment of the invention, a ratio of a thickness of the second supporting layer to a thickness of the first supporting layer is greater than 1 and less than or equal to 2.

In an embodiment of the invention, a thickness of the fixing structure is T, a thickness of the first supporting layer is T1, and $T=XT1+YCT1$, where X and Y are odd numbers, and C is a constant greater than 1 and less than or equal to 2.

In an embodiment of the invention, a flexural strength of the first supporting layer is greater than a flexural strength of the second supporting layer.

In an embodiment of the invention, a densification of the first supporting layer is greater than a densification of the second supporting layer.

In an embodiment of the invention, a Young's modulus of the first supporting layer is greater than a Young's modulus of the second supporting layer.

In an embodiment of the invention, a ratio of a thickness of the micro component to a thickness of the fixing structure is greater than 1 and less than or equal to 30.

In an embodiment of the invention, an included angle between the first supporting layer and a lateral surface of the micro component ranges from 30 degrees to 80 degrees.

In an embodiment of the invention, the fixing structure further includes a third supporting layer. The second supporting layer is located between the third supporting layer and the first supporting layer, and a refractive index of the third supporting layer is greater than 1 and less than a refractive index of the first supporting layer and a refractive index of the second supporting layer.

In an embodiment of the invention, an orthogonal projection area of the second supporting layer on the micro component is greater than or equal to an orthogonal projection area of the third supporting layer on the micro component.

In an embodiment of the invention, one of the first supporting layer and the second supporting layer is a patterned supporting layer.

In an embodiment of the invention, the micro component includes an insulating layer, the insulating layer at least covers a lateral surface and a part of a bottom surface of the micro component, the first supporting layer of the fixing structure is in direct contact with the insulating layer, and a refractive index of the insulating layer is different from a refractive index of the first supporting layer.

A micro component display device of the invention includes a display substrate and at least one micro component. The micro component is disposed on the display substrate and electrically connected to the display substrate. The micro component includes a first type semiconductor layer, a second type semiconductor layer and a light emitting layer disposed on the display substrate. A first light guiding layer and a second light guiding layer are disposed on the first type semiconductor layer. A refractive index of the first light guiding layer is greater than a refractive index of the second light guiding layer. An orthogonal projection area of the first light guiding layer on the display substrate is greater than an orthogonal projection area of the second light guiding layer on the display substrate.

Based on the above, in a design of a micro component structure of the invention, a fixing structure includes a first supporting layer connected to a micro component and a second supporting layer disposed on the first supporting layer. That is, the fixing structure of the invention at least includes two structural layers. By virtue of the design, the structural strength of the fixing structure may be enhanced. Furthermore, because the refractive index of the first supporting layer connected to the micro component is greater than the refractive index of the second supporting layer, the brightness of the overall micro component structure may be improved after subsequent transfer.

In order to make the above features and advantages of the invention more obvious and comprehensible, embodiments accompanied with drawings are described in detail below.

DESCRIPTION OF THE EMBODIMENTS

Embodiments of the invention describe a structure of a micro component (such as a Micro Light Emitting Diode (Micro LED) or a micro chip), so as to be taken and transferred onto a receiving substrate. The receiving substrate may be a display substrate, a light emitting substrate, substrates having functional components such as transistors or Integrated Circuits (ICs), or other substrates having lines, but is not limited thereto. Although some embodiments of the invention specifically describe Micro LEDs including p-n diodes, it should be understood that the embodiments of the invention are not limited thereto. Some embodiments may also be applied to other micro components, and by virtue of the mode, the components are designed to control the execution of preset electronic functions (such as diodes, transistors and ICs) or photon functions (LEDs and lasers).

Figure 1A:
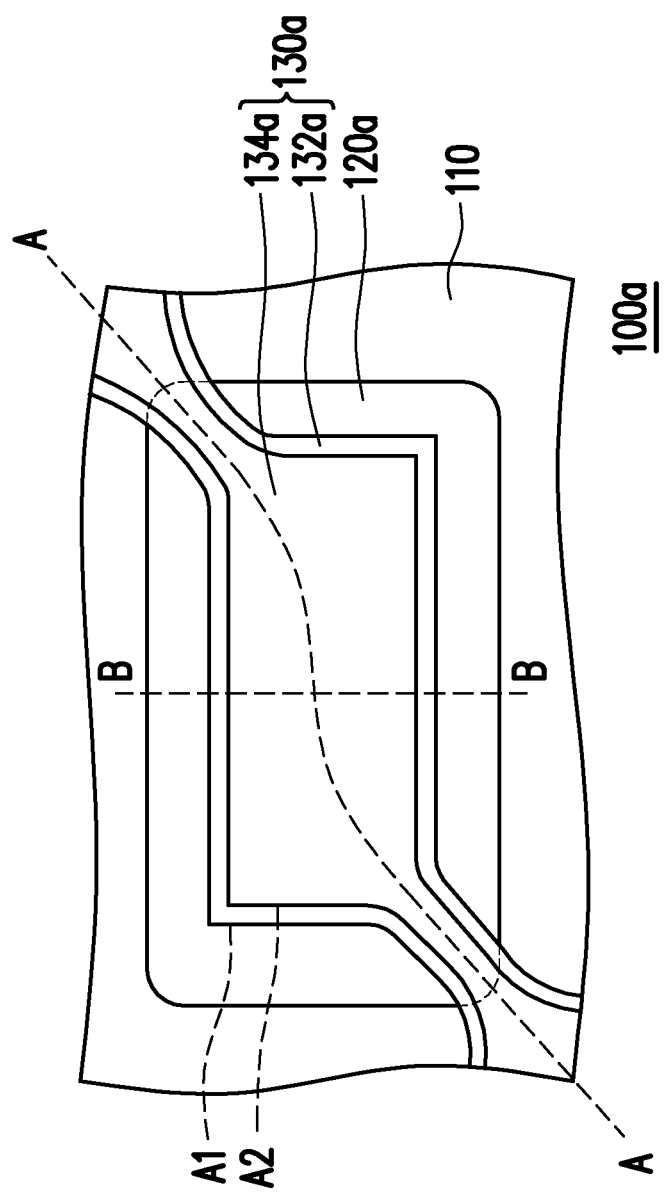
FIG. 1A is a schematic top diagram of a micro component structure according to an embodiment of the invention.
Figure 1B:
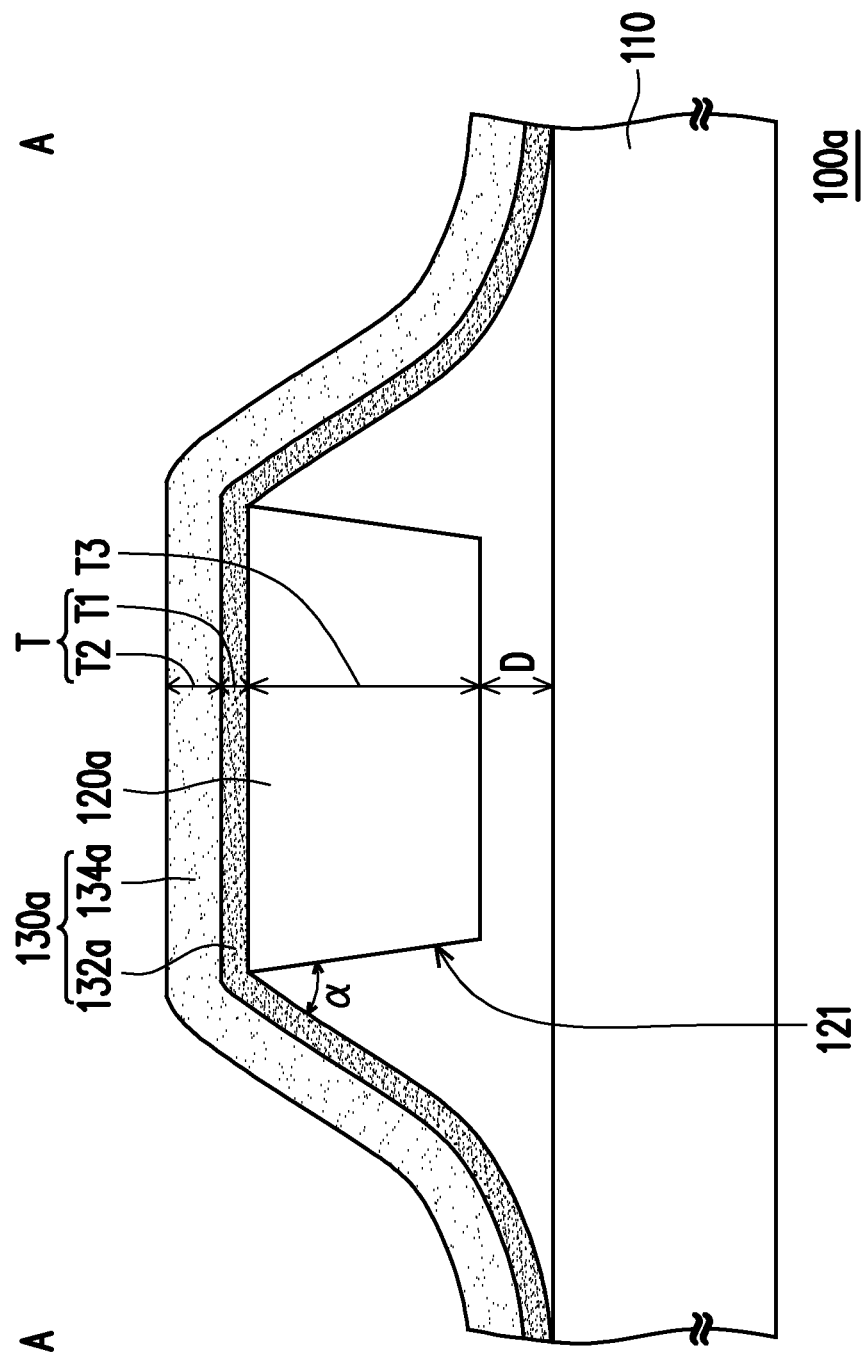
FIG. 1B is a schematic cross-sectional diagram of the micro component structure in FIG. 1A along a line A-A.
Figure 1C:
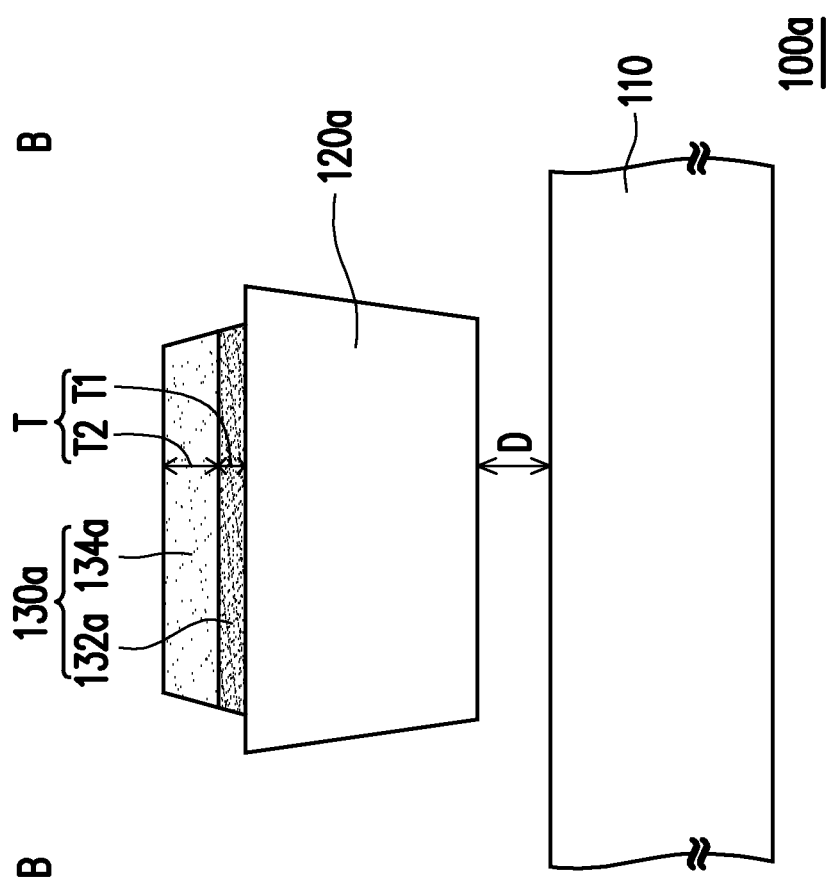
FIG. 1C is a schematic cross-sectional diagram of the micro component structure in FIG. 1A along a line B-B.

FIG. 1A is a schematic top diagram of a micro component structure according to an embodiment of the invention. FIG. 1B is a schematic cross-sectional diagram of the micro component structure in FIG. 1A along a line A-A. FIG. 1C is a schematic cross-sectional diagram of the micro component structure in FIG. 1A along a line B-B. Referring to FIG. 1A, FIG. 1B and FIG. 1C, in the present embodiment, a micro component structure 100a includes a substrate 110, a micro component 120a and a fixing structure 130a. The micro component 120a and the fixing structure 130a are disposed on the substrate 110. The micro component 120a has a spacing D from the substrate 110. Here, the spacing D between the micro component 120a and the substrate 110 is an air spacing specifically to adjust the transfer force for subsequent transfer. The fixing structure 130a includes a first supporting layer 132a and a second supporting layer 134a. The first supporting layer 132a is connected to the micro component 120a and located between the second supporting layer 134a and the micro component 120a. Particularly, a refractive index of the first supporting layer 132a is greater than a refractive index of the second supporting layer 134a. Here, the shape of the micro component 120a of the micro component structure 100a may be an inverted trapezoidal shape from a cross-sectional view, but is not limited thereto.

In detail, the material of the first supporting layer 132a may be silicon nitride (a refractive index is for example 2.03), and the material of the second supporting layer 134a may be silicon dioxide (a refractive index is for example 1.46). However, the material of the second supporting layer 134a may also be for example an organic material, such as a photoresist, but is not limited thereto. Furthermore, in the present embodiment, a first orthogonal projection area A1 of the first supporting layer 132a on the micro component 120a is greater than or equal to a second orthogonal projection area A2 of the second supporting layer 134a on the micro component 120a. Preferably, a ratio of the second orthogonal projection area A2 to the first orthogonal projection area A1 is greater than or equal to 0.8 and less than or equal to 1. If the ratio is greater than or equal to 0.8, the structural strength is good, and the overall brightness may be improved after transfer. As shown in FIG. 1A, the orthogonal projection area A1 of the first supporting layer 132a on the micro component 120a is greater than the orthogonal projection area A2 of the second supporting layer 134a on the micro component 120a, and frontal centralized light emission in a specific region is increased by virtue of the design.

Figure 1D:
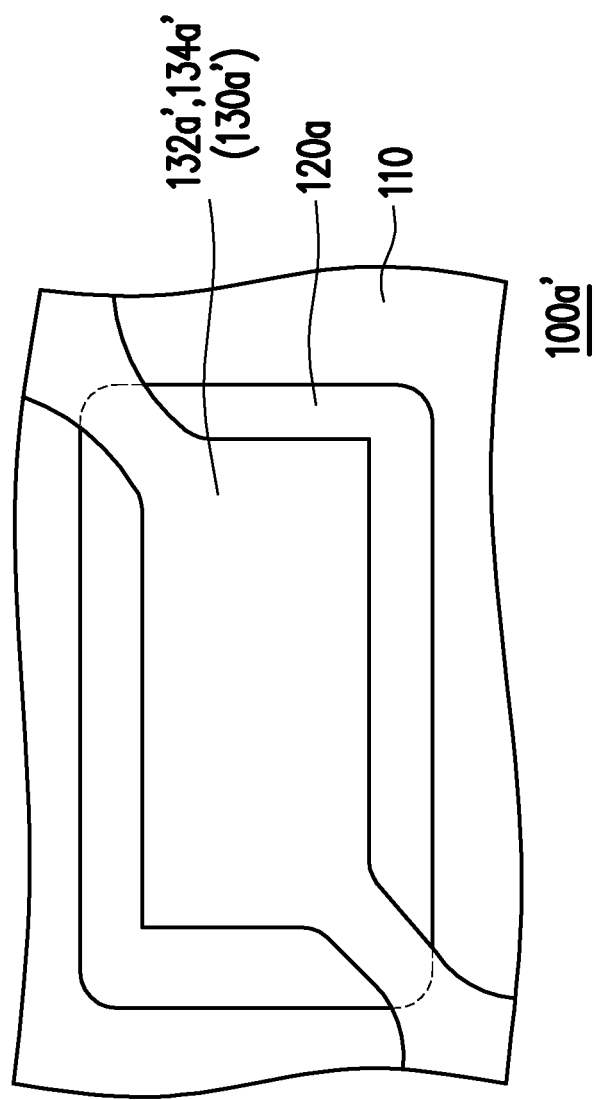
FIG. 1D is a schematic top diagram of a micro component structure according to another embodiment of the invention.

In a micro component structure 100a' according to another embodiment, as shown in FIG. 1D, an orthogonal projection shape of a first supporting layer 132a' of a fixing structure 130a' on a micro component 120a and an orthogonal projection shape of a second supporting layer 134a' on the micro component 120a are disposed conformally so as to be formed in a same process and to comprehensively increase frontal light emission. In particular, a ratio of an orthogonal projection area A1 of the first supporting layer 132a' on the micro component 120a to a surface area of the micro component 120a is less than 1 and greater than or equal to 0.8, so that lights may be centralized at a center to avoid interaction of mutual side lights after the lights are subsequently transferred onto a display substrate (not shown).

Referring to FIG. 1B and FIG. 1C, in the present embodiment, a thickness T2 of the second supporting layer 134a is greater than a thickness T1 of the first supporting layer 132a, so that the second supporting layer 134a provides a sufficient buffer during transfer. Preferably, a ratio of the thickness T2 of the second supporting layer 134a to the thickness T1 of the first supporting layer 132a is greater than 1 and less than or equal to 2. If the ratio exceeds 2, it will be difficult to control breakpoints during transfer. Preferably, the ratio of the thickness T2 of the second supporting layer 134a to the thickness T1 of the first supporting layer 132a is 1.3 to 1.4. Further, a ratio of a thickness T3 of a micro component 120a to a thickness T of a fixing structure 130a is greater than 1 and less than or equal to 30. On the other hand, the thickness of the fixing structure 130a is T, the thickness of the first supporting layer 132a is T1, T=XT1+YCT1, X and Y are odd numbers, and C is a constant greater than 1 and less than or equal to 2. That is, when X and Y are 1 respectively, the fixing structure 130a may have the thinnest thickness. Here, C is optimally 1.3 to 1.4, the structural strength of the fixing structure 130a may be enhanced, and thus, the brightness of the overall micro component structure 100a may be improved after subsequent transfer.

In an embodiment, when a micro component 120a emits a blue light, a ratio of a thickness T3 of the micro component 120a to a thickness T of a fixing structure 130a ranges from 1.5 to 30, a ratio of the thickness T3 of the micro component 120a to a thickness T1 of a first supporting layer 132a ranges from 2.5 to 55, and a ratio of the thickness T3 of the micro component 120a to a thickness T2 of a second supporting layer 134a ranges from 3.5 to 75.

In another embodiment, when a micro component 120a emits a green light, a ratio of a thickness T3 of the micro component 120a to a thickness T of a fixing structure 130a ranges from 1.3 to 30, a ratio of the thickness T3 of the micro component 120a to a thickness T1 of a first supporting layer 132a ranges from 2 to 45, and a ratio of the thickness T3 of the micro component 120a to a thickness T2 of a second supporting layer 134a ranges from 3 to 65.

In another embodiment, when a micro component 120a emits a red light, a ratio of a thickness T3 of the micro component 120a to a thickness T of a fixing structure 130a ranges from 1.1 to 25, a ratio of the thickness T3 of the micro component 120a to a thickness T1 of a first supporting layer 132a ranges from 1.5 to 40, and a ratio of the thickness T3 of the micro component 120a to a thickness T2 of a second supporting layer 134a ranges from 2.5 to 55. Because various micro components 120a are made of different epitaxial materials and have different doping concentrations, fixing structures 130a having different thicknesses may be configured by different micro components 120a so as to improve the light output of an overall micro component structure 100a.

Furthermore, in the present embodiment, a flexural strength of the first supporting layer 132a is greater than a flexural strength of the second supporting layer 134a, and a densification of the first supporting layer 132a is greater than a densification of the second supporting layer 134a. That is, compared with the second supporting layer 134a having a larger thickness T2, the first supporting layer 132a having a smaller thickness T1 is harder. In other words, the second supporting layer 134a is softer than the first supporting layer 132a. By virtue of the design, the first supporting layer 132a in contact with the micro component 120a may provide a good support force for subsequent transfer. On the other hand, a Young's modulus of the first supporting layer 132a is greater than a Young's modulus of the second supporting layer 134a, and a thermal expansion coefficient of the first supporting layer 132a is greater than a thermal expansion coefficient of the second supporting layer 134a. By virtue of the design, the second supporting layer 134a in contact with a transfer device (not shown) subsequently may provide a good buffer to the micro component 120a during transfer to prevent the micro component 120a from being damaged.

Referring to FIG. 1B, in the present embodiment, an included angle α between the first supporting layer 132a and a lateral surface 121 of the micro component 120a ranges from 30 degrees to 80 degrees. When the included angle α is less than 30 degrees, the first supporting layer 132a of the fixing structure 130a may be in contact with the micro component 120a excessively, thereby causing a difficulty in subsequent transfer. When the included angle α is greater than 80 degrees, the first supporting layer 132a of the fixing structure 130a is away from the micro component 120a excessively, thereby causing an insufficient support force.

In brief, in the design of the micro component structure 100a of the present embodiment, the fixing structure 130a includes the first supporting layer 132a connected to the micro component 120a and the second supporting layer 134a disposed on the first supporting layer 132a. That is, the fixing structure 130a of the present embodiment at least includes two structural layers. By virtue of the design, the structural strength of the fixing structure 130a may be enhanced. Furthermore, because the refractive index of the first supporting layer 132a connected to the micro component 120a is greater than the refractive index of the second supporting layer 134a, the brightness of the overall micro component structure 100a may be improved after subsequent transfer.

Figure 7:
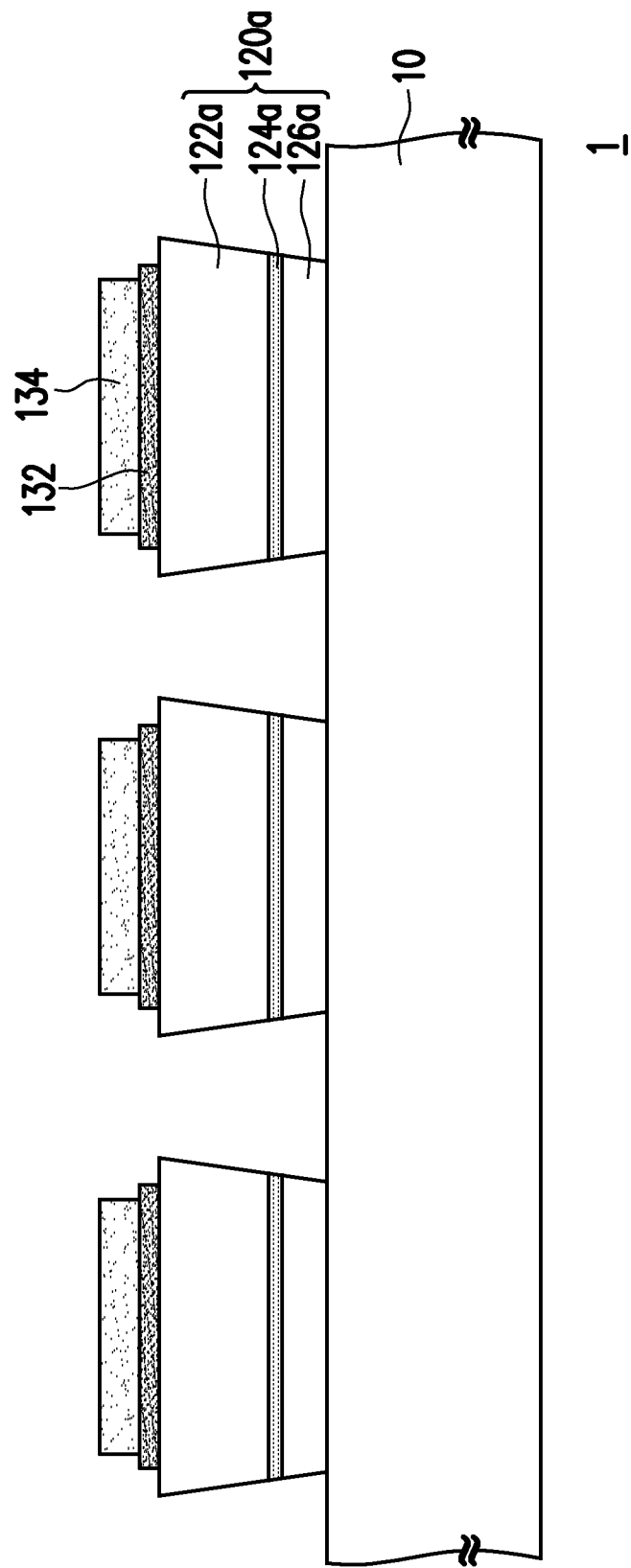
FIG. 7 is a schematic cross-sectional diagram of a micro component display device according to an embodiment of the invention.

Referring to FIG. 7, a micro component display device 1 of the present embodiment includes a plurality of micro components 120a transferred to a display substrate 10 by a transfer head (not shown) and electrically connected to the display substrate 10, wherein a micro component 120a includes a first type semiconductor layer 122a, a second type semiconductor layer 126a and a light emitting layer 124a disposed on the display substrate 10. A first light guiding layer 132 and a second light guiding layer 134 are disposed on the first type semiconductor layer 122a. In other words, during transfer of the micro component 120a, a part of the fixing structure 130a is retained on the micro component 120a, and the first light guiding layer 132 and the second light guiding layer 134 are formed. Here, a refractive index of the first light guiding layer 132 is greater than a refractive index of the second light guiding layer 134, and an orthogonal projection area of the first light guiding layer 132 on the display substrate 10 is greater than an orthogonal projection area of the second light guiding layer 134 on the display substrate 10, so that the reflection inside the micro component 120a may be avoided, centralized frontal light emission in a specific region may be increased, and it is not necessary to make another light guiding layer.

It should be noted that the following embodiments follow the component symbols and partial contents of the above embodiments, same symbols are adopted to represent same or similar components, and the descriptions of the same technical contents are omitted. The descriptions of the omitted portions may refer to the above embodiments, and the descriptions are omitted in the following embodiments.

Figure 2:
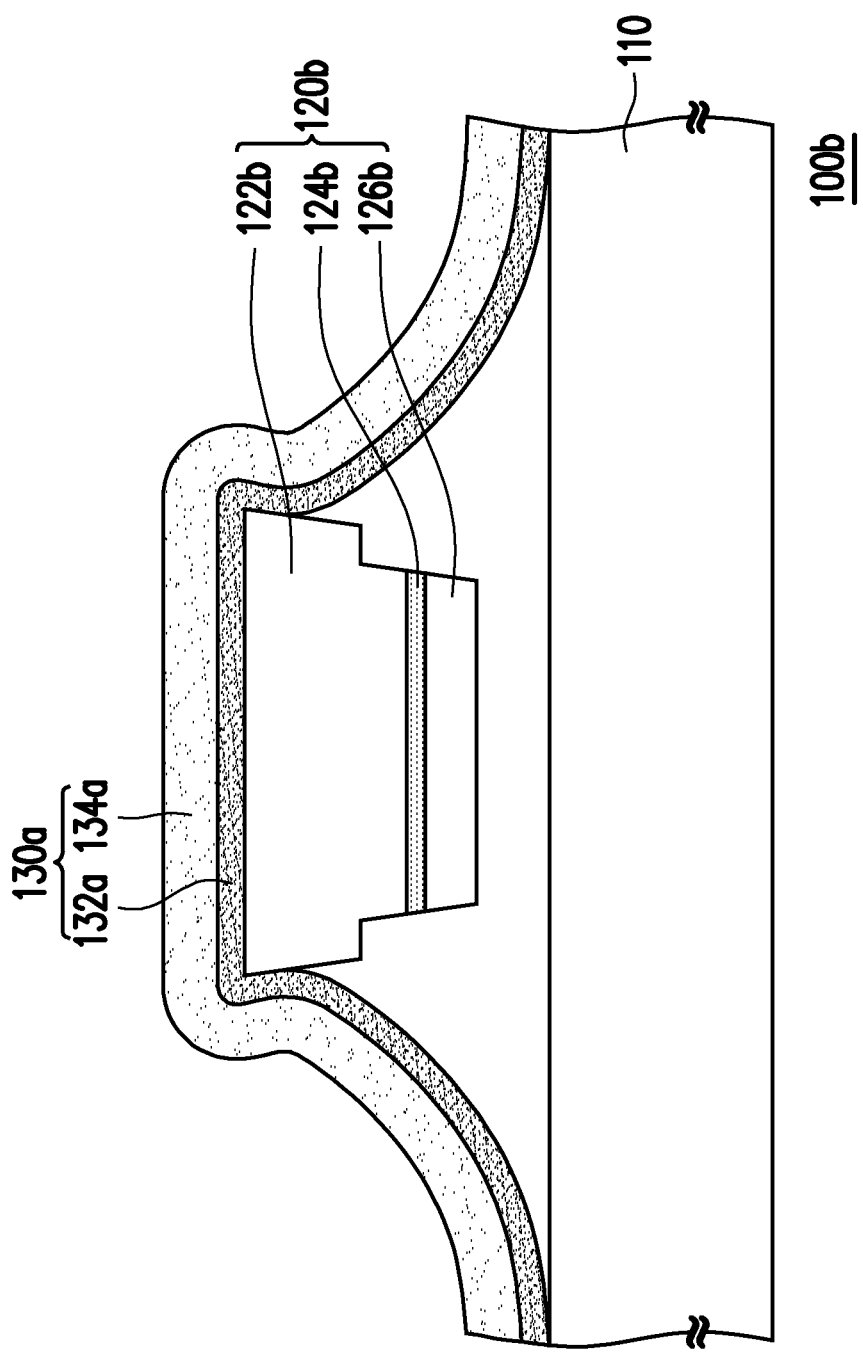
FIG. 2 is a schematic cross-sectional diagram of a micro component structure according to another embodiment of the invention.

FIG. 2 is a schematic cross-sectional diagram of a micro component structure according to another embodiment of the invention. Referring to FIG. 1B and FIG. 2, a micro component structure 100b of the present embodiment is similar to the micro component structure 100a in FIG. 1B, and the difference between the micro component structure 100b and the micro component structure 100a is as follows: from a cross-sectional view, the shape of a micro component 120b of the micro component structure 100b is an inverted trapezoidal shape having stepped side walls. Here, a fixing structure 130a is disposed on a part of a side surface of the micro component 120b. The micro component 120b further includes a first type semiconductor layer 122b, a light emitting layer 124b and a second type semiconductor layer 126b. By virtue of the design of the inverted trapezoidal shape having the stepped side walls, when the fixing structure 130a is disposed on a part of the side surface of the micro component 120b, the fixing structure 130a may be not in contact with a side surface of the light emitting layer 124b, so that the fixing structure 130a may not damage the light emitting layer 124b during subsequent transfer, but may increase a support force due to disposition on a part of the side surface.

Figure 3A:
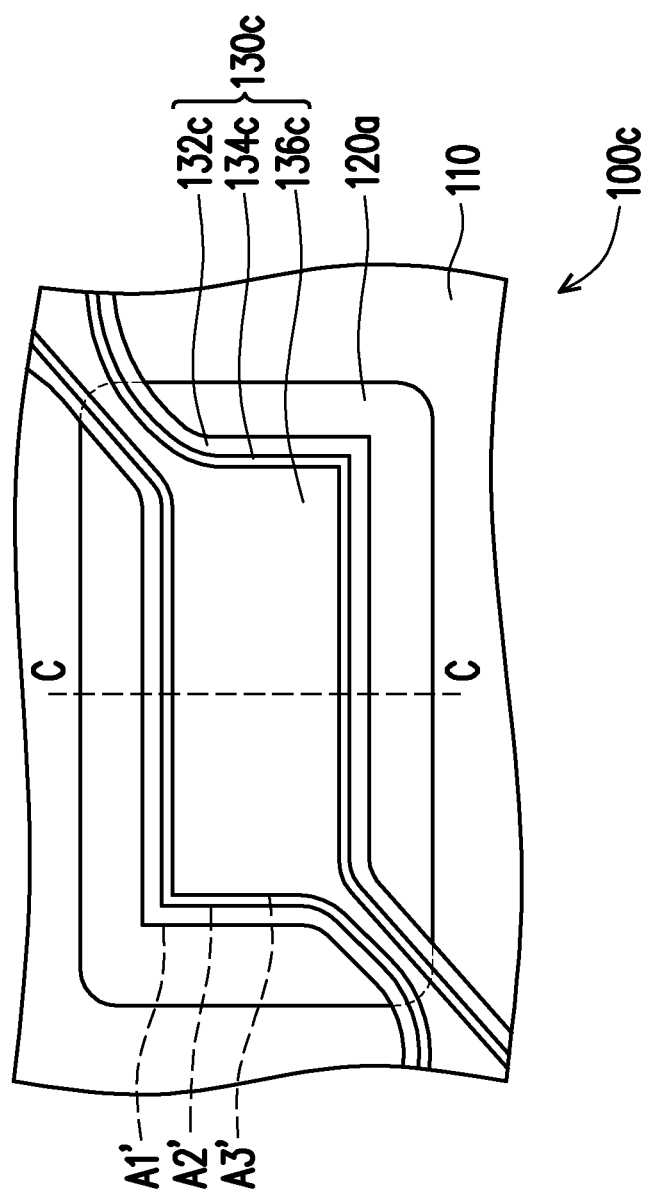
FIG. 3A is a schematic top diagram of a micro component structure according to another embodiment of the invention.
Figure 3B:
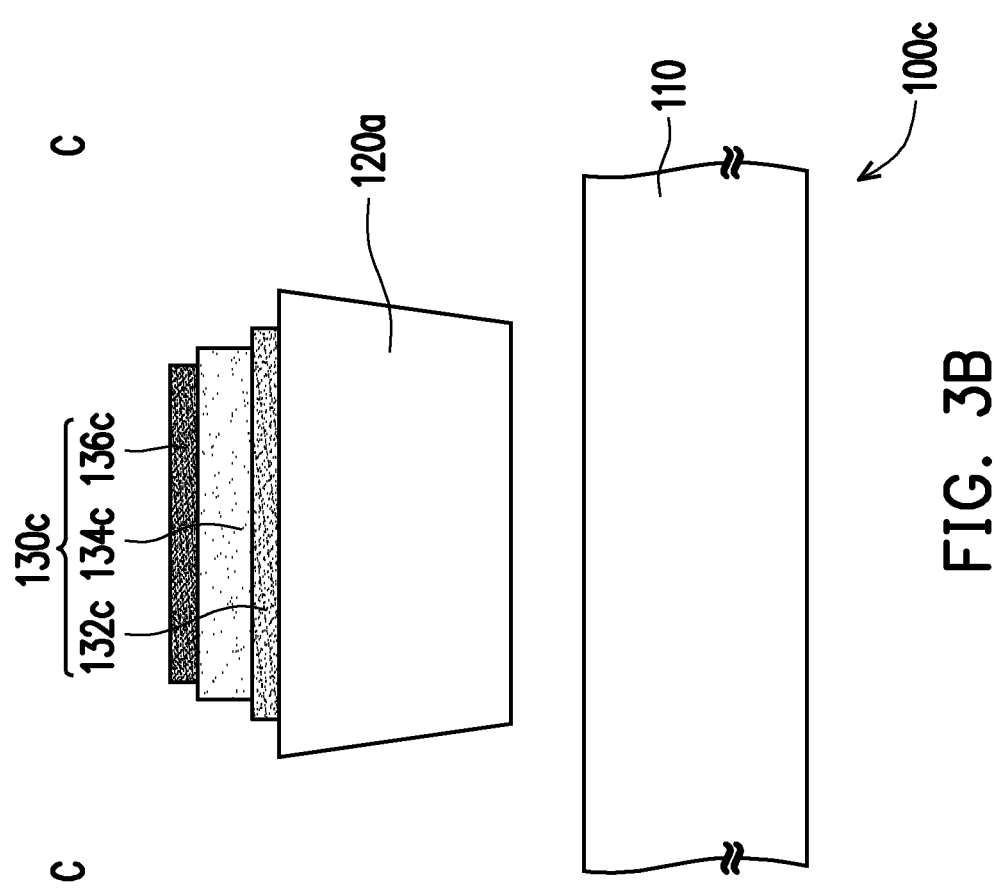
FIG. 3B is a schematic cross-sectional diagram of the micro component structure in FIG. 3A along a line C-C.

FIG. 3A is a schematic top diagram of a micro component structure according to another embodiment of the invention. FIG. 3B is a schematic cross-sectional diagram of the micro component structure in FIG. 3A along a line C-C. Referring to FIG. 1A and FIG. 3A, a micro component structure 100c of the present embodiment is similar to the micro component structure 100a in FIG. 1A, and the difference between the micro component structure 100c and the micro component structure 100a is as follows: The fixing structure 130c of the present embodiment includes a first supporting layer 132c, a second supporting layer 134c and a third supporting layer 136c, wherein the second supporting layer 134c is located between the third supporting layer 136c and the first supporting layer 132c. Particularly, a refractive index of the third supporting layer 136c is greater than 1 (greater than a refractive index of air) and less than a refractive index of the first supporting layer 132c and a refractive index of the second supporting layer 134c. Preferably, the refractive index of the third supporting layer 136c is less than the refractive index of the second supporting layer 134c, and the refractive index of the second supporting layer 134c is less than the refractive index of the first supporting layer 132c. By virtue of the design, internal total reflection generated by the light emitted from the micro component 120a may be reduced, and the light emission efficiency may be increased. In the present embodiment, the first supporting layer 132c of the fixing structure 130c has a first orthogonal projection area A1' on the micro component 120a. The second supporting layer 134c of the fixing structure 130c has a second orthogonal projection area A2' on the micro component 120a. The third supporting layer 136c of the fixing structure 130c has a third orthogonal projection area A3' on the micro component 120a. Particularly, the first orthogonal projection area A1', the second orthogonal projection area A2' and the third orthogonal projection area A3' gradually decrease. That is, the areas of the supporting layers of the fixing structure 130c gradually decrease from a direction close to the micro component 120a to a direction away from the micro component 120a so as to increase frontal light emission in a centralized mode.

Figure 4:
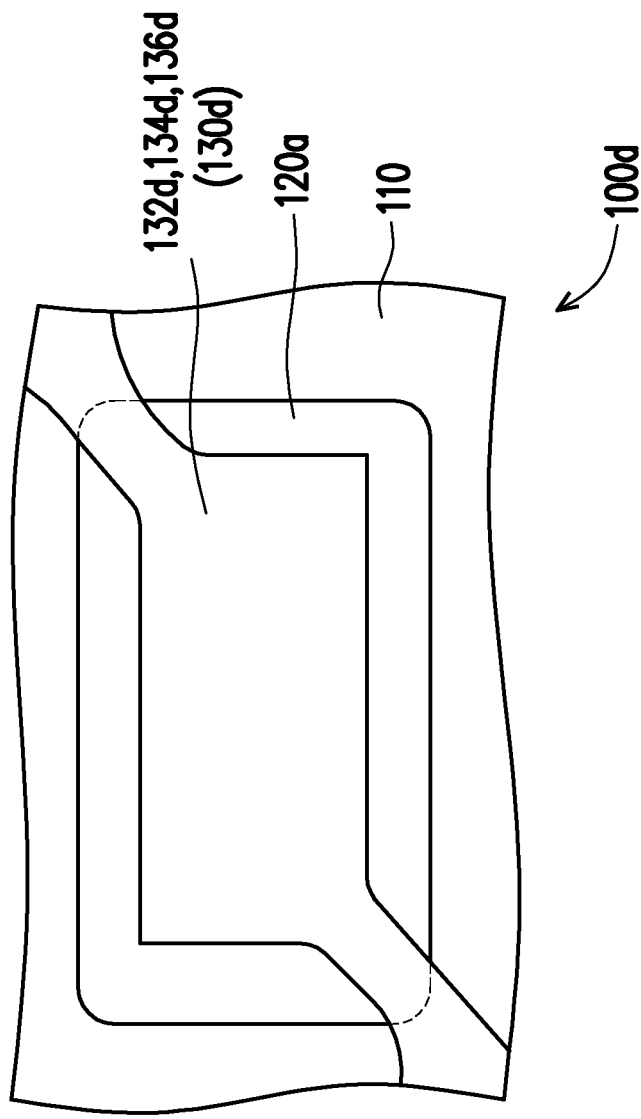
FIG. 4 is a schematic top diagram of a micro component structure according to another embodiment of the invention.

FIG. 4 is a schematic top diagram of a micro component structure according to another embodiment of the invention. Referring to FIG. 3A and FIG. 4, a micro component structure 100d of the present embodiment is similar to the micro component structure 100c in FIG. 3A, and the difference between the micro component structure 100d and the micro component structure 100c is as follows: here, an orthogonal projection shape of a first supporting layer 132d on a micro component 120a, an orthogonal projection shape of a second supporting layer 134d on the micro component 120a and an orthogonal projection shape of a third supporting layer 136d on the micro component 120a are disposed conformally. In other words, the orthogonal projection shape of the first supporting layer 132d on the micro component 120a, the orthogonal projection shape of the second supporting layer 134d on the micro component 120a and the orthogonal projection shape of the third supporting layer 136d on the micro component 120a are overlapped in orthogonal projection area, and may be formed in a same process so as to increase the process yield and comprehensively increase frontal light emission after subsequent transfer.

Figure 5:
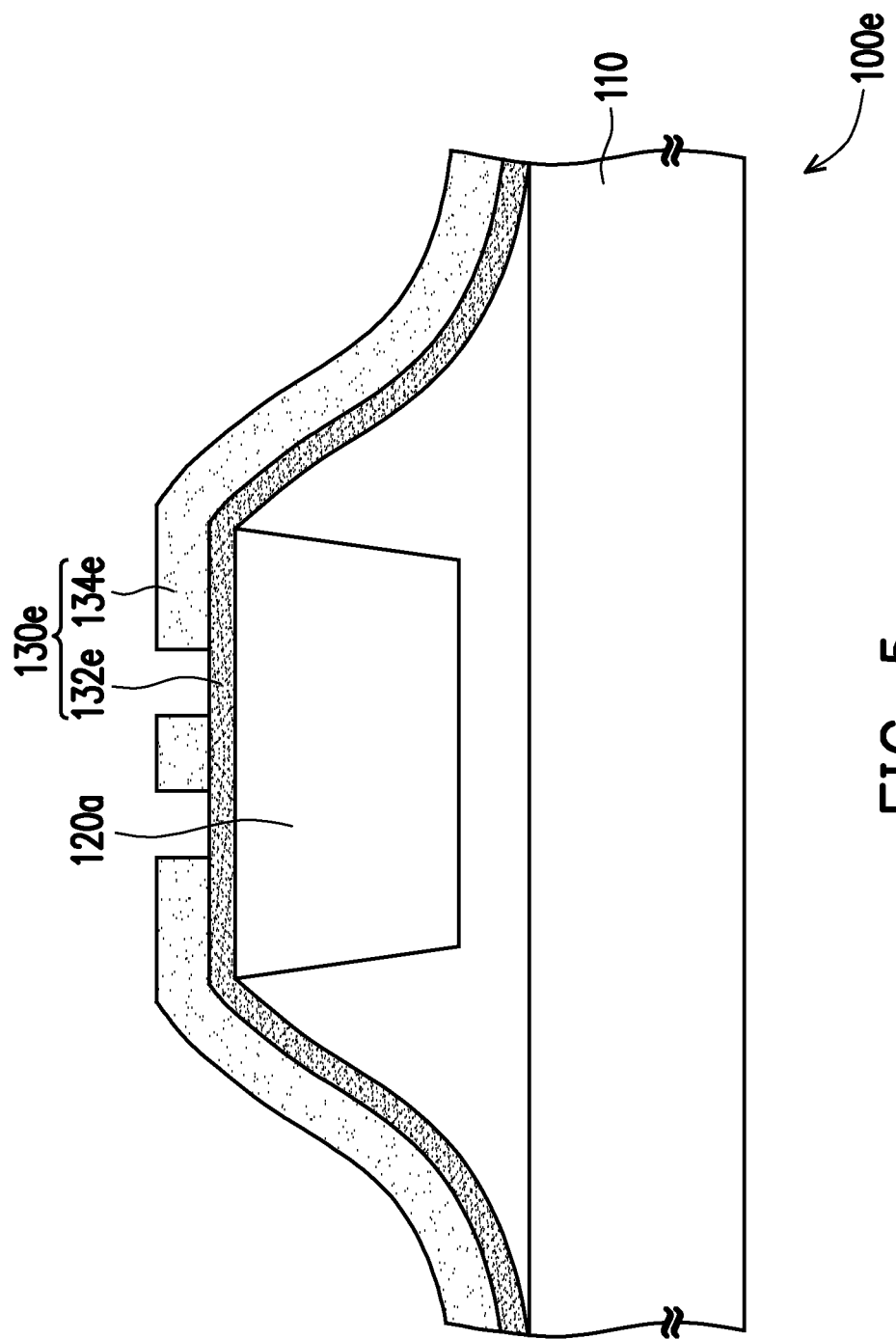
FIG. 5 is a schematic cross-sectional diagram of a micro component structure according to another embodiment of the invention.

FIG. 5 is a schematic cross-sectional diagram of a micro component structure according to another embodiment of the invention. Referring to FIG. 1C and FIG. 5, a micro component structure 100e of the present embodiment is similar to the micro component structure 100a in FIG. 1C, and the difference between the micro component structure 100e and the micro component structure 100a is as follows: a second supporting layer 134e of a fixing structure 130e of the present embodiment is a patterned supporting layer specifically, and the second supporting layer 134e exposes a part of a first supporting layer 132e. Because a gap exists between the second supporting layer 134e and the first supporting layer 132e, a better buffer space may be provided during transfer. In other embodiments not shown, a first supporting layer of a fixing structure may be a patterned supporting layer. That is, as long as one of the first supporting layer and the second supporting layer of the fixing structure is a patterned supporting layer, it belongs to the scope of protection of the invention.

Figure 6:
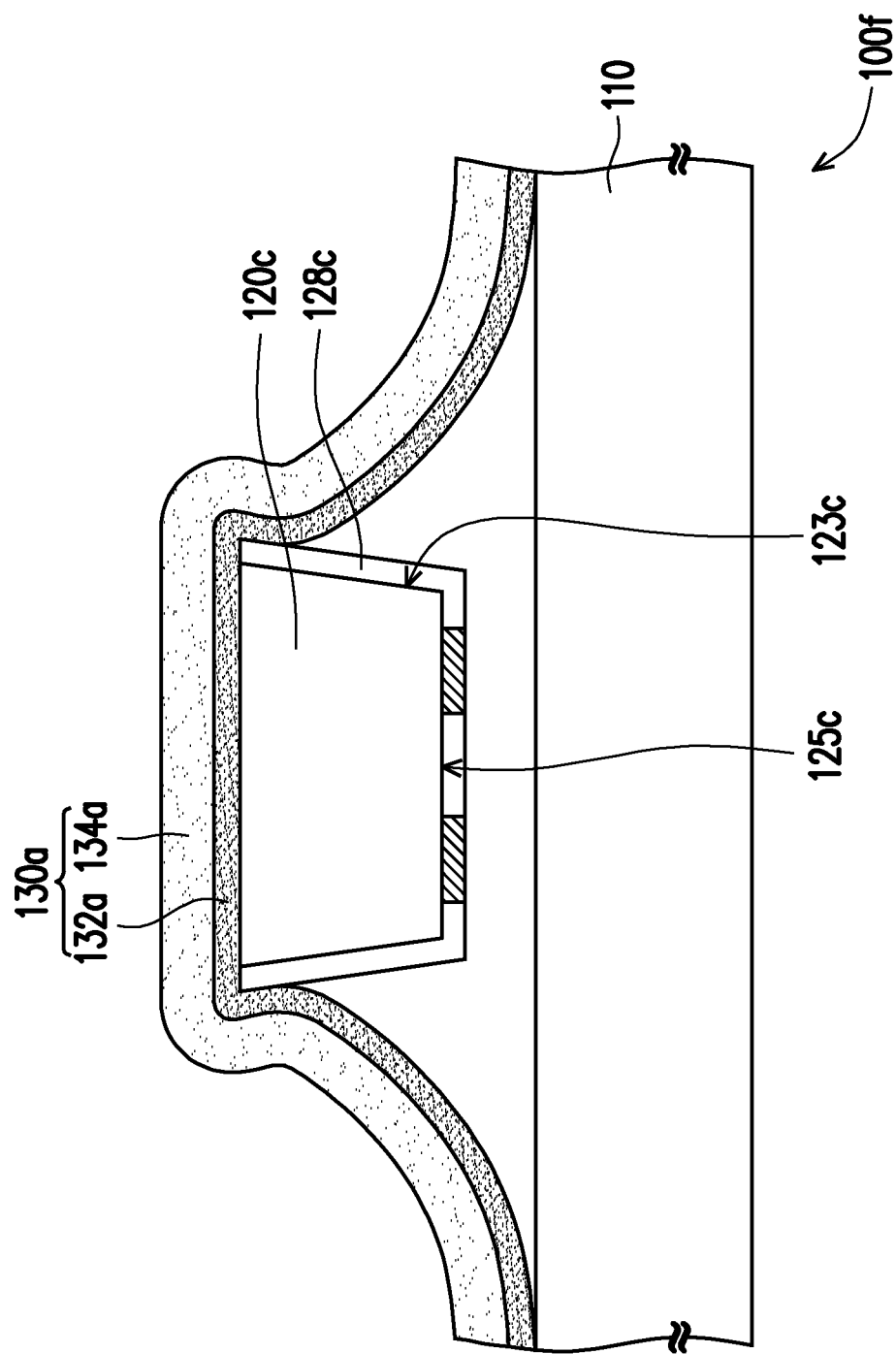
FIG. 6 is a schematic cross-sectional diagram of a micro component structure according to another embodiment of the invention.

FIG. 6 is a schematic cross-sectional diagram of a micro component structure according to another embodiment of the invention. Referring to FIG. 1B and FIG. 6, a micro component structure 100f of the present embodiment is similar to the micro component structure 100a in FIG. 1B, and the difference between the micro component structure 100f and the micro component structure 100a is as follows: a micro component 120c of the present embodiment includes an insulating layer 128c, and the insulating layer 128c at least covers a lateral surface 123c of the micro component 120c and a part of a bottom surface 125c. A first supporting layer 132a of a fixing structure 130a is in direct contact with the insulating layer 128c, a refractive index of the insulating layer 128c is different from a refractive index of the first supporting layer 132a, and more lights may be emitted according to different refractive indexes. Preferably, the refractive index of the insulating layer 128c is greater than a refractive index of the fixing structure 130a to obtain better light emission, but it is not limited thereto. Here, the densification, flexural strength and Young's modulus of the first supporting layer 132a are greater than the densification, flexural strength and Young's modulus of the insulating layer 128c so as to provide a better support during transfer.

In another embodiment, a refractive index of an insulating layer 128c may be less than a refractive index of a first supporting layer 132a of a fixing structure 130a, and the refractive index of the first supporting layer 132a is greater than a refractive index of a second supporting layer 134a, so that a micro component structure 100f has better light emission efficiency.

Based on the above, in a design of a micro component structure of the invention, a fixing structure includes a first supporting layer connected to a micro component and a second supporting layer disposed on the first supporting layer. That is, the fixing structure of the invention at least includes two structural layers. By virtue of the design, the structural strength of the fixing structure may be enhanced. Furthermore, because the refractive index of the first supporting layer connected to the micro component is greater than the refractive index of the second supporting layer, the brightness of the overall micro component structure may be improved.

Although the invention has been disclosed above by way of embodiments, it is not intended to limit the invention. It will be apparent to those skilled in the art that various modifications and variations can be made without departing from the spirit and scope of the invention. In view of the foregoing, the scope of protection of the invention will be defined by the scope of the appended claims.

What is claimed is:

1. A micro component structure, comprising:
a substrate;
a micro component disposed on the substrate and having a spacing from the substrate, wherein the spacing is an air spacing; and
a fixing structure disposed on the substrate and comprising a first supporting layer and a second supporting layer, wherein the micro component is connected to the substrate through the fixing structure, the first supporting layer is connected to a light emitting surface of the micro component away from the substrate and located between the second supporting layer and the micro component, and a refractive index of the first supporting layer is greater than a refractive index of the second supporting layer.

2. The micro component structure according to claim 1, wherein a first orthogonal projection area of the first supporting layer on the micro component is greater than or equal to a second orthogonal projection area of the second supporting layer on the micro component.

3. The micro component structure according to claim 2, wherein a ratio of the second orthogonal projection area to the first orthogonal projection area is greater than or equal to 0.8 and less than or equal to 1.

4. The micro component structure according to claim 2, wherein an orthogonal projection shape of the first supporting layer on the micro component and an orthogonal projection shape of the second supporting layer on the micro component are disposed conformally.

5. The micro component structure according to claim 1, wherein a thickness of the second supporting layer is greater than a thickness of the first supporting layer.

6. The micro component structure according to claim 5, wherein a ratio of the thickness of the second supporting layer to the thickness of the first supporting layer is greater than 1 and less than or equal to 2.

7. The micro component structure according to claim 6, wherein a thickness of the fixing structure is T, the thickness of the first supporting layer is T1, and T=XT1+YCT1, where X and Y are odd numbers, and C is a constant greater than 1 and less than or equal to 2.

8. The micro component structure according to claim 1, wherein a flexural strength of the first supporting layer is greater than a flexural strength of the second supporting layer.

9. The micro component structure according to claim 1, wherein a densification of the first supporting layer is greater than a densification of the second supporting layer.

10. The micro component structure according to claim 1, wherein a Young's modulus of the first supporting layer is greater than a Young's modulus of the second supporting layer.

11. The micro component structure according to claim 1, wherein a ratio of a thickness of the micro component to a thickness of the fixing structure is greater than 1 and less than or equal to 30.

12. The micro component structure according to claim 1, wherein an included angle between the first supporting layer and a lateral surface of the micro component ranges from 30 degrees to 80 degrees.

13. The micro component structure according to claim 1, wherein the fixing structure further comprises a third supporting layer, the second supporting layer is located between the third supporting layer and the first supporting layer, and a refractive index of the third supporting layer is greater than 1 and less than the refractive index of the first supporting layer and the refractive index of the second supporting layer.

14. The micro component structure according to claim 13, wherein an orthogonal projection area of the second supporting layer on the micro component is greater than or equal to an orthogonal projection area of the third supporting layer on the micro component.

15. The micro component structure according to claim 1, wherein one of the first supporting layer and the second supporting layer is a patterned supporting layer.

16. The micro component structure according to claim 1, wherein the micro component comprises an insulating layer, the insulating layer at least covers a lateral surface and a part of a bottom surface of the micro component, the first supporting layer of the fixing structure is in direct contact with the insulating layer, and a refractive index of the insulating layer is different from the refractive index of the first supporting layer.

17. A micro component display device, comprising:
a display substrate; and
a micro component disposed on the display substrate and electrically connected to the display substrate, wherein the micro component comprises a first type semiconductor layer, a second type semiconductor layer and a light emitting layer disposed on the display substrate, a first light guiding layer and a second light guiding layer are disposed on the first type semiconductor layer, the first light guiding layer is located between the micro component and the second light guiding layer, and the first light guiding layer directly contacts a light emitting surface of the micro component away from the substrate, a refractive index of the first light guiding layer is greater than a refractive index of the second light guiding layer, and an orthogonal projection area of the first light guiding layer on the display substrate is greater than an orthogonal projection area of the second light guiding layer on the display substrate.

* * * * *